United States Patent [19]
Eberhardt et al.

[11] Patent Number: 6,130,613
[45] Date of Patent: Oct. 10, 2000

[54] RADIO FREQUENCY INDENTIFICATION STAMP AND RADIO FREQUENCY INDENTIFICATION MAILING LABEL

[75] Inventors: Noel H. Eberhardt, Cupertino; Victor Allen Vega, Hercules; Fernando Reyes, Cupertino, all of Calif.

[73] Assignee: Motorola, Inc., Schaumburg, Ill.

[21] Appl. No.: 09/152,202

[22] Filed: Sep. 11, 1998

Related U.S. Application Data

[63] Continuation-in-part of application No. 09/094,261, Jun. 9, 1998, and a continuation-in-part of application No. 09/103,226, Jun. 23, 1998, Pat. No. 6,018,299.

[51] Int. Cl.$^7$ .................................................. G08B 13/14
[52] U.S. Cl. ..................... 340/572.7; 340/572.8
[58] Field of Search .............................. 340/572.5, 572.7, 340/572.8, 572.1, 825.35, 825.54, 505, 10.1; 235/381, 375, 101, 487; 705/401, 404, 406, 408, 410; 700/213, 225

[56] References Cited

U.S. PATENT DOCUMENTS

| | | | |
|---|---|---|---|
| 3,780,368 | 12/1973 | Northeved et al. | 340/825.54 X |
| 5,175,418 | 12/1992 | Tanaka | 235/439 |
| 5,497,140 | 3/1996 | Tuttle | 340/825.54 X |
| 5,528,222 | 6/1996 | Moskowitz et al. | 340/572.7 |
| 5,566,441 | 10/1996 | Marsh et al. | 29/600 |
| 5,682,143 | 10/1997 | Brady et al. | 340/572.7 |
| 5,786,626 | 7/1998 | Brady et al. | 257/673 |
| 5,847,447 | 12/1998 | Rozin et al. | 257/678 |
| 5,854,480 | 12/1998 | Noto | 235/492 |
| 6,001,211 | 12/1999 | Hiroyuki | 235/492 X |

FOREIGN PATENT DOCUMENTS

| 4242992 | 6/1994 | Germany | 340/FOR 102 |
|---|---|---|---|

*Primary Examiner*—Thomas Mullen
*Attorney, Agent, or Firm*—Terri S. Hughes

[57] ABSTRACT

A radio frequency identification stamp (10) includes a substrate (24) with a first surface (12) and a second surface (18). The first surface (12) is printed with indicia indicating at least a postage value. An antenna (16) is formed on the second surface (18) and a radio frequency identification circuit chip (20) is secured to the second surface (18) and coupled to the antenna (16). A layer (22) of adhesive is also disposed on the second surface (18). A mailing label (600) includes indicia (614) printed on a first surface, and an antenna (616) coupled to a radio frequency identification circuit chip (620) on a second surface (618). A layer (622) of adhesive covers the second surface. The layer bonds the circuit chip (620) to the second surface and couples the circuit chip (620) to the antenna (616). The circuit chip (620) may retain a tracking number, and more preferably, retains sender information (601), recipient information (602), service type information (603) and billing instructions (604).

24 Claims, 4 Drawing Sheets

RADIO FREQUENCY INDENTIFICATION STAMP AND RADIO FREQUENCY INDENTIFICATION MAILING LABEL

CROSS-REFERENCE TO RELATED APPLICATIONS

The present application is a continuation-in-part of U.S. patent application Ser. No. 09/094,261, filed Jun. 9, 1998, attorney docket number IND10149, entitled "Radio Frequency Identification Tag Having an Article Integrated Antenna" and U.S. patent application Ser. No. 09/103,226, filed Jun. 23, 1998, now U.S. Pat. No. 6,018,299, attorney docket IND10148, entitled "Radio Frequency Identification Tag Having A Printed Antenna and Method", the disclosures of which prior applications are hereby expressly incorporated herein by reference.

FIELD OF THE INVENTION

The present application relates to radio frequency identification tags including, but not limited to, a radio frequency identification stamp and mailing label.

BACKGROUND OF THE INVENTION

Radio frequency identification tags and radio frequency identification tag systems are known, and find numerous uses. For example, radio frequency identification tags are frequently used for personal identification in automated gate sentry applications protecting secured buildings or areas. Information stored on the radio frequency identification tag identifies the person seeking access to the secured building. A radio frequency identification tag system conveniently provides for reading the information from the radio frequency identification tag at a small distance using radio frequency (RF) data transmission technology. Most typically, the user simply holds or places the radio frequency identification tag near a base station that transmits an excitation signal to the radio frequency identification tag powering circuitry contained on the radio frequency identification tag. The circuitry, responsive to the excitation signal, communicates the stored information from the radio frequency identification tag to the base station, which receives and decodes the information.

In general, radio frequency identification tags are capable of retaining and, in operation, transmitting a substantial amount of information—sufficient information to uniquely identify individuals, packages, inventory and the like. The radio frequency identification tag is also capable of receiving and storing information. In a read/write application, the base station is not only capable of sending an excitation signal and receiving a response from the radio frequency identification tag, but it is also capable of sending a data, or write, signal to the radio frequency identification tag. The radio frequency identification tag receives the write signal, which may contain data to be stored within the tag, a code or a command. Depending on the type of write signal, the radio frequency identification tag responds accordingly, such as by storing the data or acting upon the command.

Parcel delivery services currently rely on and use optical technologies for package identification, sorting and tracking in providing delivery services. Printed bar codes and optical readers are used to identify and track packages throughout the package delivery system. A shipping label identifying the sender, recipient, service type and billing instruction is completed either by hand or through use of a label printer. The hand-completed labels are pre-printed with a bar code, while the printer generated labels are printed with a bar code. The package carrier, upon picking up the package scans the bar code, and the package is identified within the system by the coded information contained in the bar code. At various points throughout the delivery system, for example, at the distribution facility, during transfer between air/ground transport vehicles, and final delivery, the bar code is scanned for identification and verification purposes. The information is also typically communicated to and retained within a central database.

The United States Postal Service also uses bar code technology in providing mail delivery service. For example, bulk mail clients of the post office receive a discount by providing a printed bar code on envelopes used to both send and receive mail. The bar codes allow the post office to use automated sorting equipment for its sorting and delivery operations. While the post office does not typically track these package types from receipt until delivery, the ability to use automated sorting equipment greatly reduces the cost of providing postal services.

Bar code/optical technologies have a number of problems. A primary problem is that in order to read the bar code it must be visible. Thus, the package must be properly oriented with respect to the bar code reader. Another problem is that the bar code may become unreadable if, for example, it is covered with dirt, is written over by mistake, is twisted or is otherwise distorted. There must also be a reasonably large area available on the package or envelope on which to print the bar code, and bar code readers have a relatively short read range, typically about several centimeters. The coded information in the bar code is also fixed. That is, the bar code can not be reprogrammed. A new bar code must be generated and secured to the parcel or envelope taking care to remove the existing printed bar code.

In postal applications in addition to properly reading the bar code, the postage value, i.e., the amount of the stamp, must also be visible in order to verify sufficient postage has been attached to the letter or package. The postage must also be accessible, in certain applications, in order to cancel the postage by printing over the stamp.

It would be desirable to have an identification system for package and mail delivery services that is not orientation specific and does not require line of sight access. Such a system would also preferably have read ranges of at least 1 centimeter (cm) to about 10 cm and offer an ability to program and reprogram the coded data. Additionally, in general applications, the system should not be any more difficult to use than applying a stamp to a letter.

Thus, there is a need for an improved postage and/or mailing label.

DETAILED DESCRIPTION OF THE PREFERRED EMBODIMENTS

Figure 1:
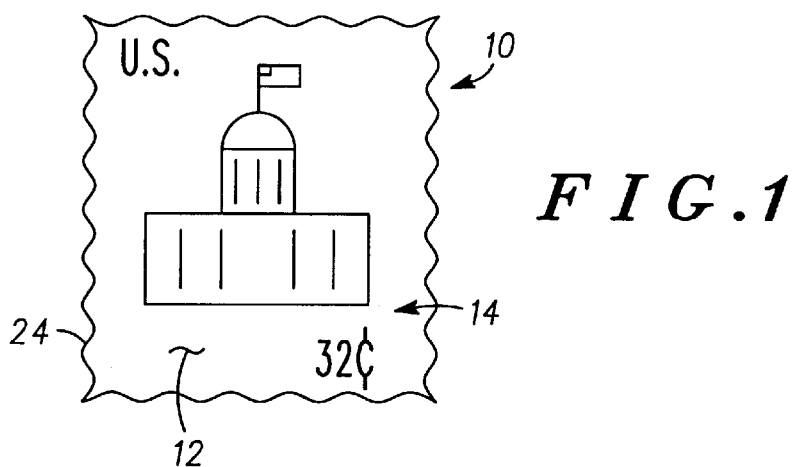
FIG. 1 is a plan view of a radio frequency identification postage stamp in accordance with a preferred embodiment of the present invention.
Figure 2:
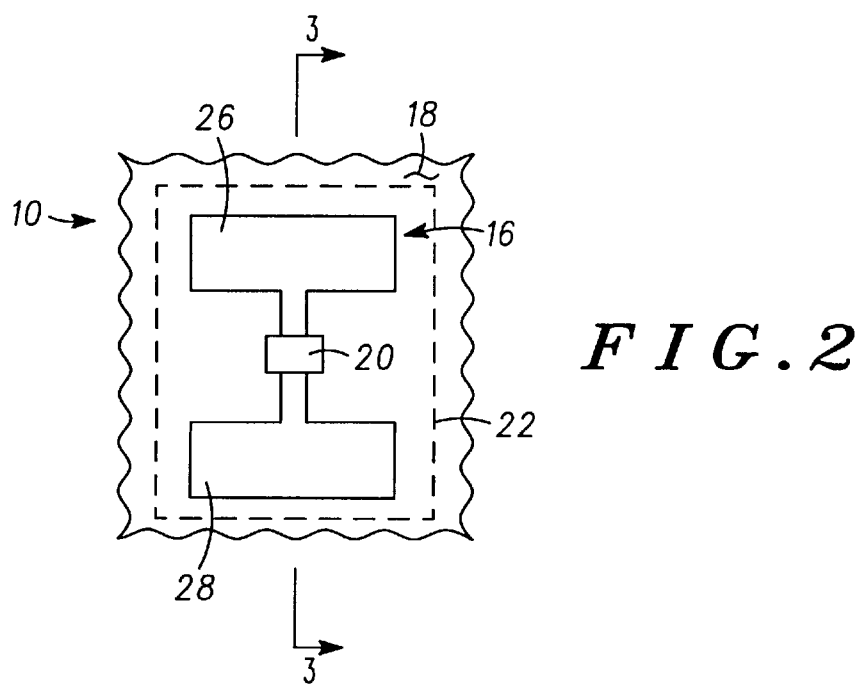
FIG. 2 is a bottom view of the radio frequency identification postage stamp shown in FIG. 1.

In accordance with preferred embodiments of the present invention, and with reference to FIG. 1 and FIG. 2, a radio frequency identification stamp ("stamp") 10 is formed by printing on a first surface 12 of a substrate 24 indicia 14 indicative of at least a postage value. An antenna 16 is formed on a second surface 18 and a radio frequency identification circuit chip ("circuit chip") 20 is secured to second surface 18 and coupled to the antenna 16. A layer 22 of adhesive, shown in phantom in FIG. 2 to better illustrate antenna 16 and circuit chip 20, is also disposed on second surface 18.

Figure 3:
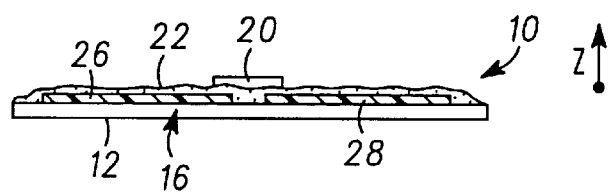
FIG. 3 is a cross-section view taken along line 3—3 of FIG. 2.

With continued reference to FIG. 1 and FIG. 2 and reference to FIG. 3, in a preferred embodiment, antenna 16 is preferably formed on second surface 18 by printing using a conductive ink or other conductive medium, such as disclosed and described in the aforementioned and incorporated U.S. Patent Applications. Layer 22 is deposited over substantially all of second surface 18, including antenna 16, bonding circuit chip 20 to second surface 18 and coupling circuit chip 20 to antenna 16. A preferred adhesive is thus a conductive anisotropic adhesive designed to conduct only in a "z" direction (as indicated in FIG. 3). As an alternative, an isotropic adhesive may be used if care is taken in the application of the isotropic adhesive to second surface 18 and in positioning circuit chip 20 to second surface 18. Layer 22 is also used to releasably secure stamp 10 to a temporary backing (not shown) and to permanently secure stamp 10 to an envelope, an article or a package (not shown).

In the preferred arrangement shown in FIG. 2, stamp 10 is a capacitive coupled device. Antenna 16 includes a first antenna element 26 and a second antenna element 28. Circuit chip 20 includes a first conductive pad and a second conductive pad (not shown) for coupling via adhesive layer 22 respectively to first antenna element 26 and second antenna element 28. It will be appreciated that stamp 10 may be arranged as an inductive coupled device with a coil antenna and a suitable inductive coupled circuit chip. It should be appreciated that other technologies for coupling circuit chip 20 to antenna 16 may be used. For example, circuit chip 20 may be coupled to antenna 16 using printing technology as shown in described in commonly assigned U.S. patent application, Attorney Docket No. IND10135, entitled "Radio Frequency Identification Tag Having Printed Circuit Interconnections", application number 09/115,279, filed Jul. 14, 1998, the disclosure of which is hereby expressly incorporated herein by reference.

Depending on the application, stamp 10 may be arranged for read only operation or for read/write operation. For example, in a fixed postage value application, such as vending stamps in standard postage value increments, a read only chip may be used and contain stored information indicative of the fixed postage value. In such a read only application, a preferred circuit chip is the Indala I341 circuit chip available from Motorola Indala Corporation, 3041 Orchard Parkway, San Jose, Calif. 95134. In the presence of an exciter signal from a suitable base station, circuit chip 20 will generate a read signal containing some or all of the stored information, for example, the postage value, and send a read signal containing the stored information to the base station. As will be described below, a mail sorting apparatus can be adapted to distinguish envelopes, parcels and packages having sufficient postage without visual inspection of the stamp by detecting the read signal containing the postage value.

It is also contemplated that stamp 10 operate in a read/write manner. In a read/write embodiment of the present invention, stamp 10 may be advantageously constructed from a TEMIC e5550 circuit chip available from Temic North America, Inc., Basking Ridge, N.J. Circuit chip 20 may contain preprogrammed stored information, such as standard postage values, and/or may, in a read/write embodiment, have information communicated to it and retained as stored information. For example, as described below with regard to FIG. 8, a postage meter can be adapted to both print stamp 10 and to write data to circuit chip 20 as stored information via a data signal. During the printing/programming process a data signal containing the stored information is communicated to stamp 10 and hence to circuit chip 20, which receives the data signal and retains the information as stored information.

Figure 4:
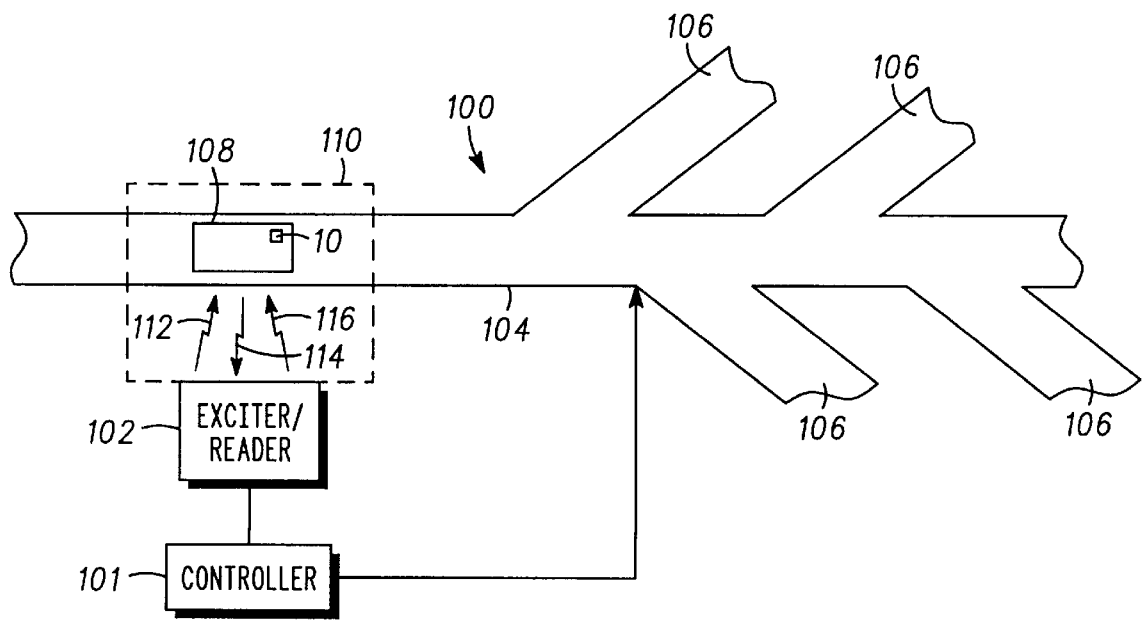
FIG. 4 is a schematic diagram of a mail/parcel sorting apparatus in accordance with a preferred embodiment of the present invention.

With reference to FIG. 4 a sorting apparatus 100, for sorting for example mail and/or other parcels or packages, includes an exciter/reader station 102, a conveyor 104 including a plurality of diverter paths, each of which is generally indicated as 106. During mail sorting, for example, exciter/reader station 102 provides an exciter signal 112, such as an electrostatic excitation signal, as package 108 enters identification zone 110. Package 108, such as an envelope, parcel or package, includes a stamp 10, and stamp 10 becomes energized in the presence of exciter signal 112. In accordance with the programming within circuit chip 20, stamp 10 generates a read signal 114 containing some or all of the stored information. Preferably, the read signal contains at least one of a postage value and a zip code. Sorting apparatus 100 also includes a controller 101 coupled to exciter/reader station 102, to which the read signal is communicated. From the read signal, controller 101 may determine if sufficient postage value is present and, if a zip code is programmed, direct package 108 along one of the diverter paths 106 accordingly by sending a signal to a diverter controller (not shown). Additionally, sorting apparatus 100 may be adapted to provide a data signal 116 to stamp 10. Data signal 116 may contain additional stored information to be retained in circuit chip 20, such as additional tracking and routing information, and may also provide data canceling the postage value, i.e., canceling stamp 10. Each of the forgoing operations may be accomplished as package 108 is conducted through the sorting apparatus 100 and without visually inspecting or accessing stamp 10 and without visually referencing a printed bar code.

Figure 5:
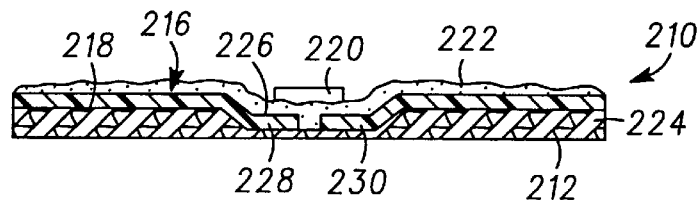
FIG. 5 is a cross-section view similar to FIG. 3 and illustrating an alternate preferred embodiment of the present invention.

Referring now to FIG. 5, a radio frequency identification stamp ("stamp") 210 in accordance with alternate preferred embodiment of the present invention is shown in cross-section. Stamp 210 is formed by printing on a first surface 212 of a substrate 224 indicia (not shown) indicative of at least a postage value. An antenna 216 is formed on a second surface 218. Second surface 218 is further formed with a recess 226 as a localized depression of substrate 224. A radio frequency identification circuit chip ("circuit chip") 220 is disposed within recess 226 and is secured to second surface 218 and coupled to the antenna 216. A layer 222 of adhesive is also disposed on second surface 218.

With continued reference to FIG. 5, in a preferred embodiment, antenna 216 is preferably formed on second surface 218 by printing using a conductive ink or other conductive medium and includes a first coupling region 228 and a second coupling region 230 extending into recess 226. Layer 222 is deposited over substantially all of second surface 218, including antenna 216, and particularly first coupling region 228 and second coupling region 230, bonding circuit chip 20 to second surface 218 and coupling circuit chip 220 to antenna 216. A preferred adhesive is thus a conductive anisotropic adhesive. An isotropic adhesive may be used if care is taken in the application of the isotropic adhesive to second surface 218 and in positioning circuit chip 220 to second surface 218. Layer 222 is also used to releasably secure stamp 210 to a temporary backing (not shown) and to permanently secure stamp 210 to an envelope, an article or a package (not shown).

Figure 6:
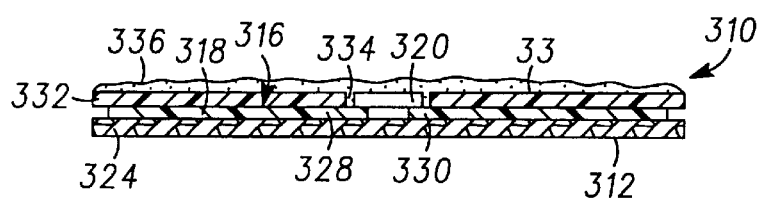
FIG. 6 is a cross-section view similar to FIG. 3 and illustrating an alternate preferred embodiment of the present invention.

Referring now to FIG. 6, a radio frequency identification stamp ("stamp") 310, in accordance with alternate preferred embodiment of the present invention is shown in cross-section. Stamp 310 is formed by printing on a first surface 312 of a substrate 324 indicia (not shown) indicative of at least a postage value. An antenna 316 is formed on a second surface 318. Substrate 324 forms a first layer of a laminate, and at least a second layer 332 is disposed over substrate 324 and is bonded to second surface 318 and antenna 316. Second layer 332 includes an aperture 334 into which a radio frequency identification circuit chip ("circuit chip") 320 is disposed and is secured to second surface 318 and coupled to antenna 316. A layer 336 of adhesive is disposed over a surface 335 of second layer 332 and also covering circuit chip 320.

With continued reference FIG. 6, in a preferred embodiment, antenna 316 is preferably formed on second surface 318 by printing using a conductive ink or other conductive medium and includes a first coupling region 328 and a second coupling region 330 accessible within aperture 334. Circuit chip 320 is bonded using a suitable conductive adhesive to second surface 318 within aperture 334 and is coupled to antenna 316 via first coupling region 328 and second coupling region 330. Once coupled to antenna 316 and bonded to second surface 318, layer 336 is applied over surface 335 and covering circuit chip 320. Layer 336 is used to releasably secure stamp 310 to a temporary backing (not shown) and to permanently secure stamp 310 to an envelope, an article or a package (not shown).

Figure 7:
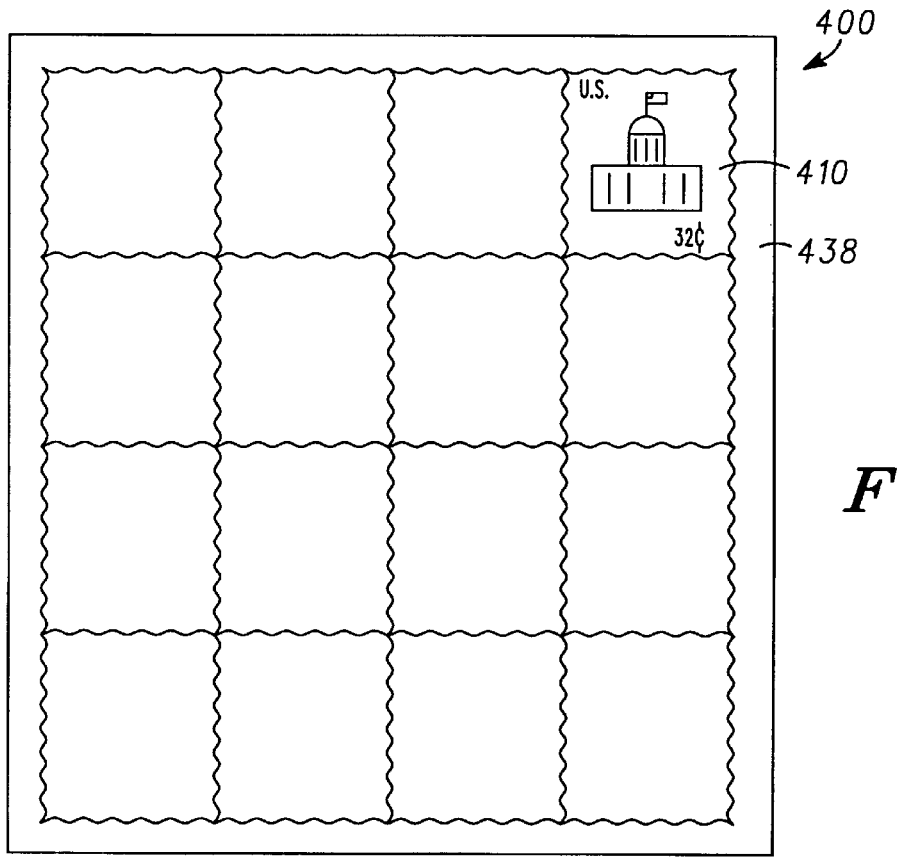
FIG. 7 is a plan view of a package of radio frequency identification postage stamps in accordance with a preferred embodiment of the present invention.

Referring now to FIG. 7, a package of radio frequency identification stamps ("package") 400 includes a plurality of radio frequency identification stamps (one of which is shown as 410) releasably bonded to a backing 438. Each of stamps 410 are constructed in accordance with the present invention as described in terms of the several preferred embodiments, and are further preferably pre-programmed with a fixed postage value. Package 400 provides a convenient way of selling radio frequency identification stamps of fixed value in bulk. Of course, it will be appreciated that package 400 may be in roll, booklet, sheet or any other suitable form without departing from the fair scope of the invention.

Figure 8:
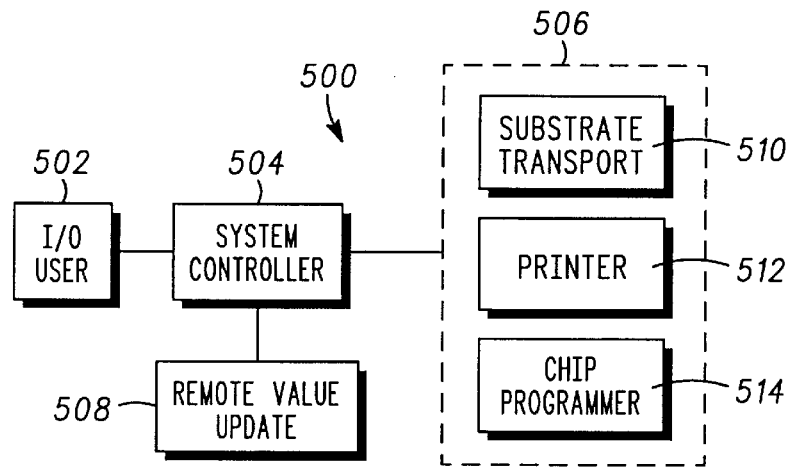
FIG. 8 is a block diagram of a postage and/or mailing label printing station in accordance with a preferred embodiment of the present invention.

Referring now to FIG. 8, an apparatus 500 for printing and programming radio frequency identification stamps in accordance with preferred embodiments of the present invention includes a user interface 502, a controller 504 and a printer/programming station 506. User interface 502 allows a user to input to controller 504 a desired postage value for a radio frequency identification stamp and to instruct controller 504 to print the desired stamp. Controller 504 includes a memory (not shown) in which purchased postage value is retained, and if sufficient purchased postage is available, causes printer/programming station 506 to generate the desired stamp. Controller 504 may also be coupled, for example via a modem, to a remote postage value update facility 508 where additional postage value may be purchased. Upon purchasing postage value, either by facility 508 or otherwise, the memory within controller 504 is updated with the information relating to the available postage value.

User interface 502 may also include a scale and provide for calculating postage value, which upon authorization by the user to print the desired stamp, is communicated to controller 504. Additionally, the user may also input a zip code and potentially other delivery information such as a complete address via user interface 502. Printing/programming station 506 includes a substrate transport 510, a printer 512 and a circuit chip programmer 514. Substrate transport 510 is arranged to conduct blank or preprinted substrate (not shown) through printer/programming station 506, and printer 512 is arranged to print indicia on the substrate. For example the indicia may be indicative of a postage value. In this regard, printer/programming station 506 is comparable to commercially available postage meter devices.

Printer/programming station 506 further includes circuit chip programmer 514, and the substrate is formed as described with respect to the various of the preferred embodiments of the present invention to include an antenna, a circuit chip coupled to the antenna and an adhesive layer. Circuit chip programmer is arranged to provide at least an exciter signal and a data signal to the substrate being printed via suitable antenna. The circuit chip becomes energized in the presence of the exciter signal. The circuit chip further receives and acts upon the data signal. The data signal preferably contains at least one of a postage value and a zip code, but may as described, contain additional delivery information. The information contained in the data signal is retained within the circuit chip as stored information, and the completed stamp is ejected from printer/programming station 506. The user then attaches the stamp using the adhesive layer to an envelope or package and mails it in the ordinary fashion.

Figures 9, 10:
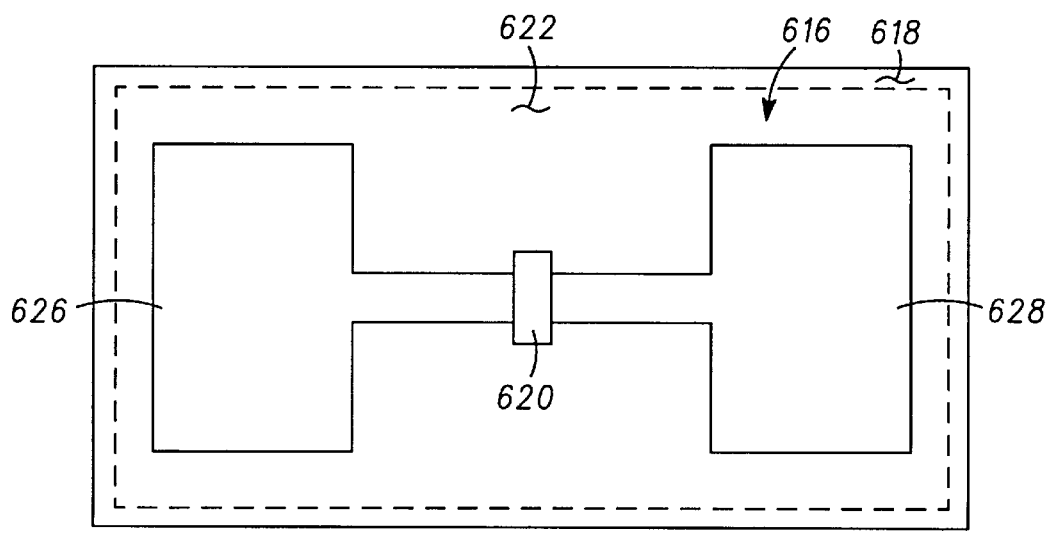
FIG. 9 is a plan view of a mailing label in accordance with a preferred embodiment of the present invention.
FIG. 10 is a bottom view of the mailing label shown in FIG. 9.

Referring now to FIG. 9 and FIG. 10, the concept of the radio frequency identification stamp is extended to a radio frequency identification mailing label 600 ("mailing label"). Mailing label 600 is formed by printing on a first surface 612 of a substrate 624 indicia 614 indicative of delivery information. Delivery information, for example, may include sender information 601, recipient information 602, delivery service information 603 and billing instruction 604. An antenna 616 is formed on a second surface 618 and a radio frequency identification circuit chip ("circuit chip") 620 is secured to second surface 618 and coupled to the antenna 616. A layer 622 of adhesive, shown in phantom in FIG. 10 to better illustrate antenna 616 and circuit chip 620, is also disposed on second surface 618.

With continued reference to FIG. 9 and FIG. 10, in a preferred embodiment, antenna 616 is preferably formed on second surface 618 by printing using a conductive ink or other conductive medium, such as disclosed and described in the aforementioned and incorporated U.S. patent applications. Layer 622 is deposited over substantially all of second surface 618, including antenna 616, bonding circuit chip 620 to second surface 618 and coupling circuit chip 620 to antenna 616. A preferred adhesive is thus a conductive anisotropic adhesive designed to conduct in a single direction. As an alternative, an isotropic adhesive may be used if care is taken in the application of the isotropic adhesive to second surface 618 and in positioning circuit chip 620 to second surface 618. Layer 622 is also used to releasably secure mailing label 600 to a temporary backing (not shown) and to permanently secure mailing label 600 to an envelope, an article or a package (not shown).

In the preferred arrangement shown in FIG. 9 and FIG. 10, mailing label 600 is a capacitive coupled device. Antenna 616 includes a first antenna element 626 and a second antenna element 628. Circuit chip 620 includes a first conductive pad and a second conductive pad (not shown) for coupling via adhesive layer 622 respectively to first antenna element 626 and second antenna element 628. It will be appreciated that mailing label 600 may be arranged as an inductive coupled device with a coil antenna and a suitable inductive coupled circuit chip. It should be appreciated that other technologies for coupling circuit chip 620 to antenna 616 may be used. For example, circuit chip 620 may be coupled to antenna 616 using printing technology as shown in described in the aforementioned commonly assigned U.S. patent application, Attorney Docket No. IND10135, entitled "Radio Frequency Identification Tag Having Printed Circuit Interconnections", the disclosure of which is hereby expressly incorporated herein by reference. It will be further appreciated that substrate 624 may be formed with a recessed portion for receiving circuit chip 620 and/or a laminate structure having an aperture for receiving circuit chip 620.

Depending on the application, mailing label 600 may be arranged for read only operation or for read/write operation. For example, in pre-printed blank mailing label applications where a user manually completes the required delivery information, a read only chip may be used and contain stored information including an article tracking number. In such a read only application, a preferred circuit chip is the Indala 1341 circuit chip available from Motorola Indala Corporation, 3041 Orchard Parkway, San Jose, Calif. 95134. In the presence of an exciter signal from a suitable base station, circuit chip 620 will generate a read signal containing some or all of the stored information, for example, the tracking number, and send the read signal containing the stored information to the base station. A delivery person upon receipt of the package may manually enter the deliver information into a central database associating the delivery information with the tracking number. It will be appreciated that the article sorting apparatus described above with respect to FIG. 4 may be easily adapted for sorting articles based upon the tracking number and information contained in the central database.

It is also contemplated that mailing label 600 operate in a read/write manner. In a read/write embodiment of the present invention circuit chip 620 may be advantageously constructed from a TEMIC e5550 circuit chip available from Temic North America, Inc., Basking Ridge, N.J. Circuit chip 620 may contain preprogrammed stored information, such as a tracking number, customer account number, and the like and/or may, in the read/write embodiment, have information communicated to it and retained as stored information. For example, a label printing apparatus may be adapted to both print indicia 614 on first surface 612 and to program circuit chip 620. Circuit chip 620 may then be programmed to contain such information as sender, recipient address, delivery service type and billing information. Such information may then be read from circuit chip 620 during article sorting operations permitting automated sorting and automated billing. For example, once mailing label 600 is prepared and circuit chip 620 is programmed, the stored information may be read throughout the delivery operation for routing the associated package to its proper destination. Additionally, upon delivery, the billing instruction is read and the appropriate party invoiced for the services. Should delivery instructions change, circuit chip 620 may be easily reprogrammed with the new delivery information using the same procedures.

In summary and referring again to FIG. 1, a radio frequency identification stamp 10 includes a substrate 24 with a first surface 12 and a second surface 18. The first surface 12 is printed with indicia indicating at least a postage value. An antenna 16 is formed on the second surface 18 and a radio frequency identification circuit chip 20 is secured to the second surface 18 and coupled to the antenna 16. A layer of adhesive 22 is also disposed on the second surface 18.

Referring to FIG. 5 and FIG. 6, in a first alternate preferred embodiment, a recess 226 is formed in a second surface 218 and the circuit chip 220 is disposed within the recess 226. In a second alternate preferred embodiment, the substrate 324 is a laminate wherein substrate 324 forms a first layer and the laminate includes at least a second layer 332. At least one of the substrate 324 and the second layer 332 is formed with an aperture 326, and the circuit chip 320 is disposed within the aperture 326 and is secured to the other of the substrate 324 and the second layer 332 and coupled to an antenna 316.

Referring to FIG. 4, a sorting apparatus 100 includes an exciter/reader station 102 adjacent an identification zone 110 along a conveyor 104 including a plurality of diverter paths 106. Exciter/reader station 102 is arranged to provide an exciter signal 112, such as an electrostatic excitation signal, as package 108 enters identification zone 110. Package 108, such as an envelope, parcel or package, includes a stamp 10, and stamp 10 becomes energized in the presence of exciter signal 112 and generates a read signal 114 containing some or all of the stored information. Sorting apparatus 100 also includes a controller 101 coupled to exciter/reader station 102, to which the read signal is communicated, and the controller 101 determines if a proper postage value is present and, if a zip code is programmed, directs package 108 along one of the diverter paths 106 accordingly.

Additionally, sorting apparatus 100 may be adapted to provide a data signal 116 to stamp 10. The data signal may contain additional stored information to be retained in circuit chip 20, such as additional tracking and routing information, and may also provide data canceling the postage value, i.e., canceling stamp 10.

Referring to FIG. 8, a stamp printer/programmer includes a user interface 502, a controller 504 and a printer/programming station 506. Data is received from user interface 502 and controller directs printer/programming station 506 to generate a radio frequency identification stamp having printed indicia and a programmed circuit chip. The user may input a postage value or a postage value may be automatically calculated, in addition a user may enter at least a zip code and potentially delivery address information. A substrate transport 510 within printer/programming station 506 advances a blank substrate to printer 512, which prints the appropriate indicia. The printed substrate is advanced to the circuit chip programmer and an exciter signal and data signal are communicated to the substrate and energizing the circuit chip. The circuit chip receives the data signal and retains, as appropriate, the stored information.

Referring to FIG. 9 and FIG. 10 a radio frequency identification mailing label 600 includes indicia 614 printed on a first surface, and an antenna 616 coupled to a radio frequency identification circuit chip 620 disposed on a second surface 618. A layer 622 of adhesive covers the second surface including the antenna 616. The layer bonds the circuit chip 620 to the second surface and couples the circuit chip 620 to the antenna 616. The circuit chip 620 may retain a tracking number, and more preferably, retains sender information 601, recipient information 602, service type information 603 and billing instructions 604.

Many additional changes and modifications could be made to the invention without departing from the fair scope and spirit thereof. The scope of some changes is discussed above. The scope of others will become apparent from the appended claims.

We claim:

1. A radio frequency identification stamp comprising:
   a substrate having a first surface and a second surface, the first surface printed with indicia indicating at least a postage value,
   a first antenna element and a second antenna element formed on the second surface of the substrate;
   a radio frequency identification circuit chip, having first and second conductive pads, secured to the first and second antenna elements, and
   a layer of adhesive disposed on substantially all of the second surface of the substrate and the first and second antenna elements.

2. The radio frequency identification stamp of claim 1, the layer of adhesive substantially covering the second surface including the antenna and securing the radio frequency identification circuit chip to the first and second antenna elements.

3. The radio frequency identification stamp of claim 2, the layer of adhesive comprising an anisotropic adhesive.

4. The radio frequency identification stamp of claim 1, the radio frequency identification circuit chip comprising one of an inductive coupled device and a capacitive coupled device.

5. The radio frequency identification stamp of claim 1, the radio frequency identification circuit chip including stored information, the stored information comprising at least one of a postage value, a zip code and delivery information.

6. The radio frequency identification stamp of claim 1, the radio frequency identification circuit chip arranged to receive a data signal containing at least one of a postage value and a zip code, and to retain the at least one of a postage value and a zip code as stored information.

7. The radio frequency identification stamp of claim 1, the radio frequency identification circuit chip containing stored information and, responsive to an exciter signal, arranged to generate and send a read signal comprising the stored information.

8. The radio frequency identification stamp of claim 7, the radio frequency identification circuit chip arranged to electrostatically send the read signal.

9. The radio frequency identification stamp of claim 1 wherein the radio frequency identification stamp is for use in a capacitively powered data communication system.

10. A radio frequency identification stamp, for use in a capacitively powered data communication system, comprising:
    a substrate, the substrate having a first surface and a second surface, the first surface printed with indicia indicating at least a postage value,
    an antenna formed on the second surface;
    a radio frequency identification circuit chip secured to the second surface and coupled to the antenna, and
    a layer of adhesive disposed on the second surface,
    wherein a recess is formed in the second surface and the radio frequency identification circuit chip being disposed within the recess.

11. A radio frequency identification stamp, for use in a capacitively powered data communication system, comprising:
    a substrate, the substrate having a first surface and a second surface, the first surface printed with indicia indicating at least a postage value,
    an antenna formed on the second surface;
    a radio frequency identification circuit chip secured to the second surface and coupled to the antenna, and
    a layer of adhesive disposed on the second surface,
    wherein the substrate comprises a laminate of a first layer and a second layer, and at least one of the first layer and the second layer formed with an aperture and the radio frequency identification circuit chip disposed within the aperture.

12. A package of radio frequency identification stamps comprising:
    a plurality of radio frequency identification stamps, each radio frequency identification stamp having:
        a substrate including a first surface and a second surface, the first surface printed with an indicia, the indicia at least
        indicating a postage value; and
            a first antenna element and a second antenna element formed on the second surface of the substrate;
        a radio frequency identification circuit chip, having first and second conductive pads, secured to the first and second antenna elements; and
    an adhesive layer disposed on substantially all of the second surface of the substrate and the first and second antenna elements, the adhesive layer releasably securing the plurality of radio frequency identification stamps to the package.

13. The package of radio frequency identification stamps of claim 12, the adhesive layer arranged to, upon removal of a radio frequency identification stamp from the package, permanently secure the radio frequency identification stamp to an article.

14. A radio frequency identification mailing label comprising:
    a substrate having a first surface and a second surface, the first surface printed with indicia indicative of delivery information;
    a first antenna element and a second antenna element formed on the second surface of the substrate;
    a radio frequency identification circuit chip, having first and second conductive pads, secured to the first and second antenna elements; and
    a layer of adhesive disposed on substantially all of the second surface of the substrate and the first and second antenna elements.

15. The radio frequency identification mailing label of claim 14, the layer of adhesive covering substantially the second surface of the substrate including the first and second antenna elements and securing the radio frequency identification circuit chip to the first and second antenna elements.

16. The radio frequency identification mailing label of claim 15, the layer of adhesive comprising a conductive anisotropic adhesive, the layer of adhesive further coupling the radio frequency identification circuit chip to the first and second antenna elements.

17. The radio frequency identification mailing label of claim 14 the radio frequency identification circuit chip comprising one of an inductive coupled device and a capacitive coupled device.

18. The radio frequency identification mailing label of claim 14, the radio frequency identification circuit chip including stored information, the stored information comprising at least one of a sender information, a recipient information, a delivery service information and a billing instruction.

19. The radio frequency identification mailing label of claim 14, the radio frequency identification circuit chip arranged to receive a data signal containing at least one of a sender information, a recipient information, a delivery service information and a billing instruction, and to retain the at least one of a sender information, a recipient information, a delivery service information and a billing instruction as stored information.

20. The radio frequency identification mailing label of claim 14, the radio frequency identification circuit chip containing stored information and, responsive to an exciter signal, arranged to generate and send a read signal comprising the stored information.

21. The radio frequency identification mailing label of claim 20, the radio frequency identification circuit chip arranged to electrostatically send the read signal.

22. The radio frequency identification mailing label of claim 14 wherein the radio frequency identification mailing label is for use in a capacitively powered data communication system.

23. A radio frequency identification mailing label, for use in a capacitively coupled data communication system, comprising:

a substrate, the substrate having, a first surface and a second surface, the first surface printed with indicia indicative of delivery information;

an antenna formed on the second surface and a radio frequency identification circuit chip secured to the second surface and coupled to the antenna; and a layer of adhesive disposed on the second surface, wherein a recess is formed in the second surface and the radio frequency identification circuit chip being disposed within the recess.

24. A radio frequency identification mailing label, for use in a capacitively coupled data communication system, comprising:

a substrate, the substrate having a first surface and a second surface, the first surface printed with indicia indicative of delivery information;

an antenna formed on the second surface and a radio frequency identification circuit chip secured to the second surface and coupled to the antenna; and a layer of adhesive disposed on the second surface, wherein the substrate comprises a laminate of a first layer and a second layer, and at least one of the first layer and the second layer formed with an aperture and the radio frequency identification circuit chip disposed within the aperture.

* * * * *